(12) United States Patent
Ohnishi et al.

(10) Patent No.: US 6,972,627 B2
(45) Date of Patent: Dec. 6, 2005

(54) HIGH FREQUENCY POWER AMPLIFIER MODULE

(75) Inventors: Masami Ohnishi, Hachioji (JP); Hitoshi Akamine, Maebashi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/368,475

(22) Filed: Feb. 20, 2003

(65) Prior Publication Data

US 2003/0201827 A1   Oct. 30, 2003

(30) Foreign Application Priority Data

Apr. 26, 2002 (JP) .............................. 2002-125303

(51) Int. Cl.[7] .............................................. H03G 3/30
(52) U.S. Cl. .................................... 330/285; 330/133
(58) Field of Search ............................... 330/133, 134, 330/279, 285, 296

(56) References Cited

U.S. PATENT DOCUMENTS 6,690,237 B2 * 2/2004 Miyazawa .................. 330/285

FOREIGN PATENT DOCUMENTS

JP   2001-127701   5/2001

* cited by examiner

Primary Examiner—Steven J. Mottola
(74) Attorney, Agent, or Firm—Mattingly, Stanger, Malur & Brundidge, P.C.

(57) ABSTRACT

The present invention provides a power amplifier module used in a cellular phone or the like. In the power amplifier module, a bias control circuit converts a bias voltage to a current by MOS transistors, whereby a voltage drop is reduced and the value of the bias voltage is lowered. Bias control signals outputted from the bias control circuit are inputted to a high-frequency amplifying unit through low-pass filters. The low-pass filter comprises an inductance, and a condenser. Each of the condensers attenuates an envelope frequency. Each of the inductances suppresses a change in impedance at a carrier frequency of a modulation signal.

17 Claims, 4 Drawing Sheets

5: POWER AMPLIFYING MODULE (HIGH-FREQUENCY POWER AMPLIFYING MODULE)
7a: CURRENT CONVERTING UNIT (FIRST BIAS CONTROL CIRCUIT)
7b: CURRENT CONVERTING UNIT (SECOND BIAS CONTROL CIRCUIT)
7c: AMPLIFYING UNIT (FIRST BIAS CONTROL CIRCUIT)
7d: AMPLIFYING UNIT (SECOND BIAS CONTROL CIRCUIT)
10,11: REFERENCE VOLTAGE GENERATING CIRCUITS (REFERENCE VOLTAGE GENERATION PARTS)
17,18: LOW-PASS FILTERS
BA1~BA4: BUFFER AMPLIFIERS (OP AMPLIFIERS)
Cp1,CP2: CONDENSERS (ELECTROSTATIC CAPACITIVE ELEMENTS)
HBTa: TRANSISTOR (SECOND TRANSISTOR)
HBTb: TRANSISTOR
Lp1,Lp2: INDUCTANCES

HIGH FREQUENCY POWER AMPLIFIER MODULE

BACKGROUND OF THE INVENTION

The present invention relates to a high frequency power amplifier module, and particularly to a technology effective if applied to a high output amplifying technology for a high frequency signal.

A cellular phone has recently been in widespread use as one mobile communication. A diversity request has been made even to its functions. Demands for high efficiency and high linearity have been made to, for example, a high frequency power amplifier module used in a cellular phone in order to extend a communication time interval and transmit larger quantity of information in a short period of time upon transfer or the like of image information.

Therefore, specs required of a power amplifier used in the high frequency power amplifier module have become also severe. It is necessary to decrease the dependence of power gain on the output and reduce an operating current.

In order to obtain such high efficient and linear characteristics, the power amplifier takes a so-called multifinger configuration wherein a plurality of GaAs HBTs (Heterojunction Bipolar Transistors) are connected in parallel.

Further, the power amplifier is provided with a bias control circuit for controlling a bias correction when a power amplification factor and output power or the like change due to the temperature or the like.

According to investigations of the present inventors, the bias control circuit makes use of an emitter follower circuit made up of two transistors, for example. A bias control signal generated by the emitter follower circuit is supplied to a base terminal of each HBT in the power amplifier to thereby perform bias control.

Incidentally, Unexamined Patent Publication No. 2001-127701 has been disclosed as an example in which this type of power amplifier module has been described in detail. This reference has described the technology of controlling power gain of a power amplifier.

SUMMARY OF THE INVENTION

However, the present inventors have found out that the bias control technology for the high frequency power amplifier module involves the following problems.

Namely, when transistors constituting an emitter follower are of GaAs HBTs, an operable base-to-emitter voltage (Vbe) for each transistor is about 1.4V or more. Thus, since the two transistors are provided here, a control voltage of Vbe=Vbe1+Vbe2 (1.4V×2)=about 2.8V or more are required.

Further, a problem arises in that a voltage larger than the Vbe voltage is required as a collector voltage for operating the two transistors, and a reduction of power relative to the control voltage becomes difficult.

Thus, there is a need to provide a power circuit or the like for generating a high-tension control voltage. This will interfere with reductions in size, cost and power consumption of the high frequency power amplifier module.

A problem arises in that when multifinger power amplifiers are connected in a multistage (e.g., two-stage) form, a high frequency signal inputted to a given one power amplifier leaks into other power amplifiers through bias control circuits, so that an adjacent channel leakage power ratio (ACPR) is degraded.

An object of the present invention is to provide a high frequency power amplifier module capable of reducing a bias voltage for performing bias control on a power amplifier made using HBTs and the like and improving an ACPR.

The above, other objects and novel features of the present invention will become apparent from the description of the present specification and the accompanying drawings.

A summary of a typical one of the inventions disclosed in the present application will be described in brief as follows:

1. A high frequency power amplifier module comprises a transistor which performs current amplification, based on a bias control signal inputted to a base terminal thereof, a first bias control circuit which generates the bias control signal, a low-pass filter connected between an output portion of the first bias control circuit and the base terminal of the transistor, and a reference voltage generating unit which generates a reference voltage from a converted current. The first bias control circuit includes a current conversion unit which converts a bias voltage into a current to thereby generate the converted current, and a buffer which effects buffering on the reference voltage generated by the reference voltage generating unit.

Summaries of other inventions of the present application will be shown in brief.

2. The high frequency power amplifier module as defined in the item 1 further includes a second transistor which is connected to a pre-stage of the transistor and performs current amplification, based on a bias control signal inputted to a base terminal thereof, a second bias control circuit which generates the bias control signal supplied to the second transistor, and a reference voltage generating unit which generates a reference voltage from a converted current. The second bias control circuit includes a current conversion unit which converts a bias voltage into a current and thereby generates the converted current, and a buffer which effects buffering on the reference voltage generated by the reference voltage generating unit.

3. In the high frequency power amplifier module as defined in the item 1 or 2, the current conversion unit includes an op amplifier having a voltage follower configuration, a first MOS transistor which has a gate connected to an output portion of the op amplifier and which is connected in series between a power supply voltage and a reference potential to generate a first current, and a second MOS transistor whose gate is connected to the output portion of the op amplifier and which is connected in series between the power supply voltage and the reference voltage generating unit to generate a second current of the same level as the first current. The buffer includes a voltage follower-coupled op amplifier.

4. In the high frequency power amplifier module as defined in any one of the items 1 to 3, the low-pass filter includes an inductance connected in series between the output portion of the first bias control circuit and the base terminal of the transistor, and an electrostatic capacitive element connected between the inductance and the reference potential. The inductance is formed of bonding wires.

5. In the high frequency power amplifying module as defined in any one of the items 1 to 4, input portions of the first and second bias control circuits are commonly connected and inputted with the bias voltage in common.

6. In the high frequency power amplifier module as defined in any one of the items 1 to 5, the low-pass filter is provided at an input-side terminal of an op amplifier in the buffer.

7. In the high frequency power amplifier module as defined in any one of the items 1 to 6, the transistor includes a plurality of transistors parallel-connected to one another.

8. In the high frequency power amplifier module as defined in any one of the items 2 to 7, the second transistor includes a plurality of second transistors parallel-connected to one another.

9. In the high frequency power amplifier module as defined in any one of the items 1 to 8, the transistor comprises a GaAs HBT.

10. In the high frequency power amplifier module as defined in any one of the items 2 to 9, the second transistor is made up of a GaAs HBT.

DETAILED DESCRIPTION OF THE PREFERRED EMBODIMENTS

Preferred embodiments of the present invention will hereinafter be described in detail with reference to the accompanying drawings.

Figure 1:
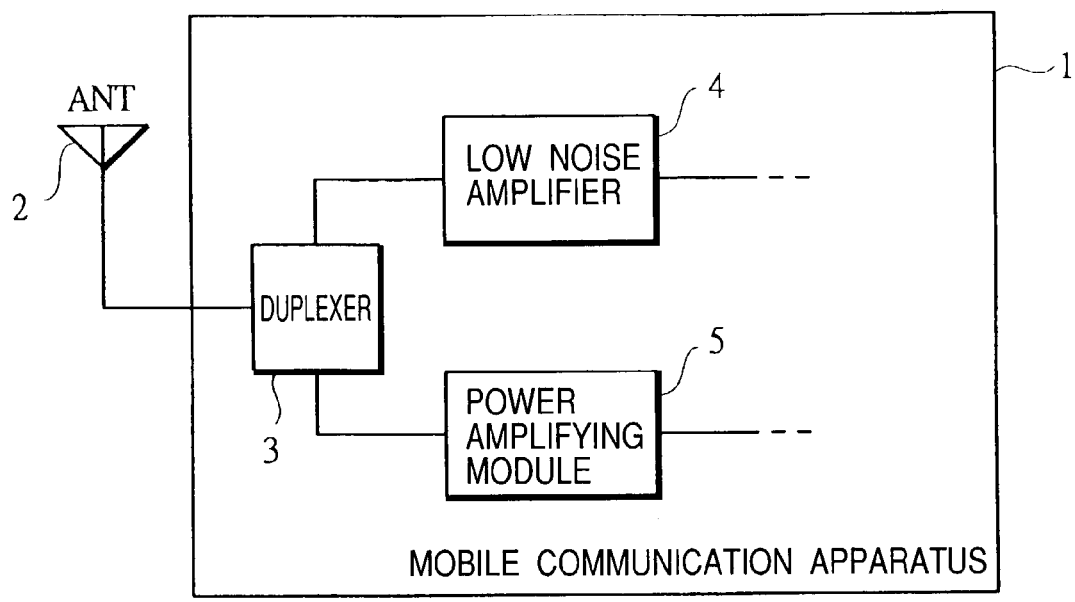
FIG. 1 is a block diagram schematically showing a mobile communication apparatus according to one embodiment of the present invention.
Figure 2:
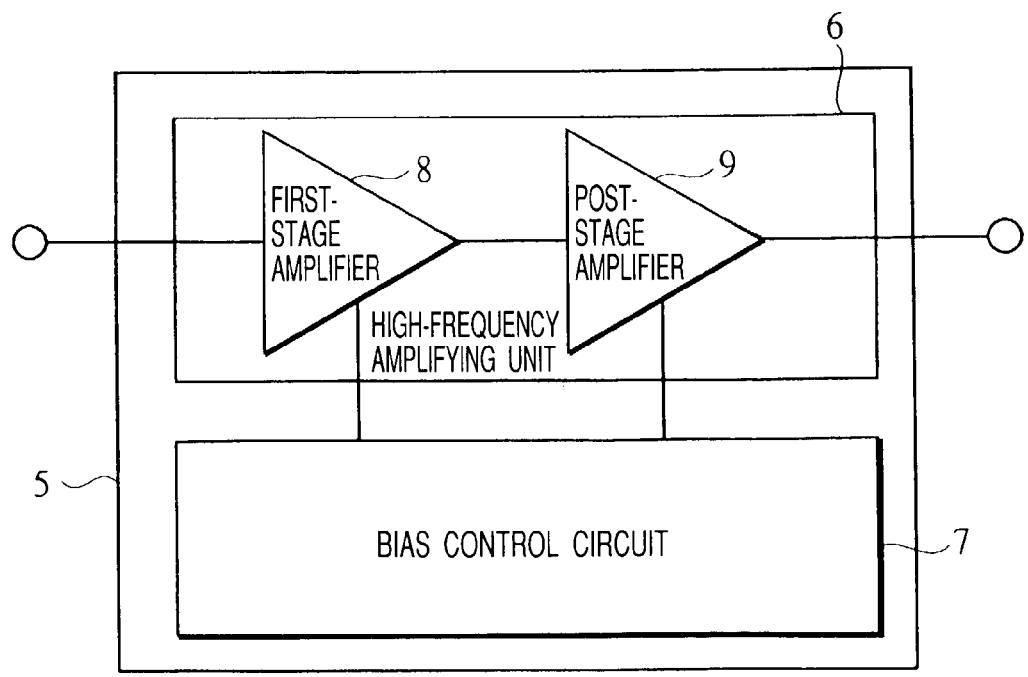
FIG. 2 is a block diagram of a power amplifier module provided in the mobile communication apparatus shown in FIG. 1.
Figure 3:
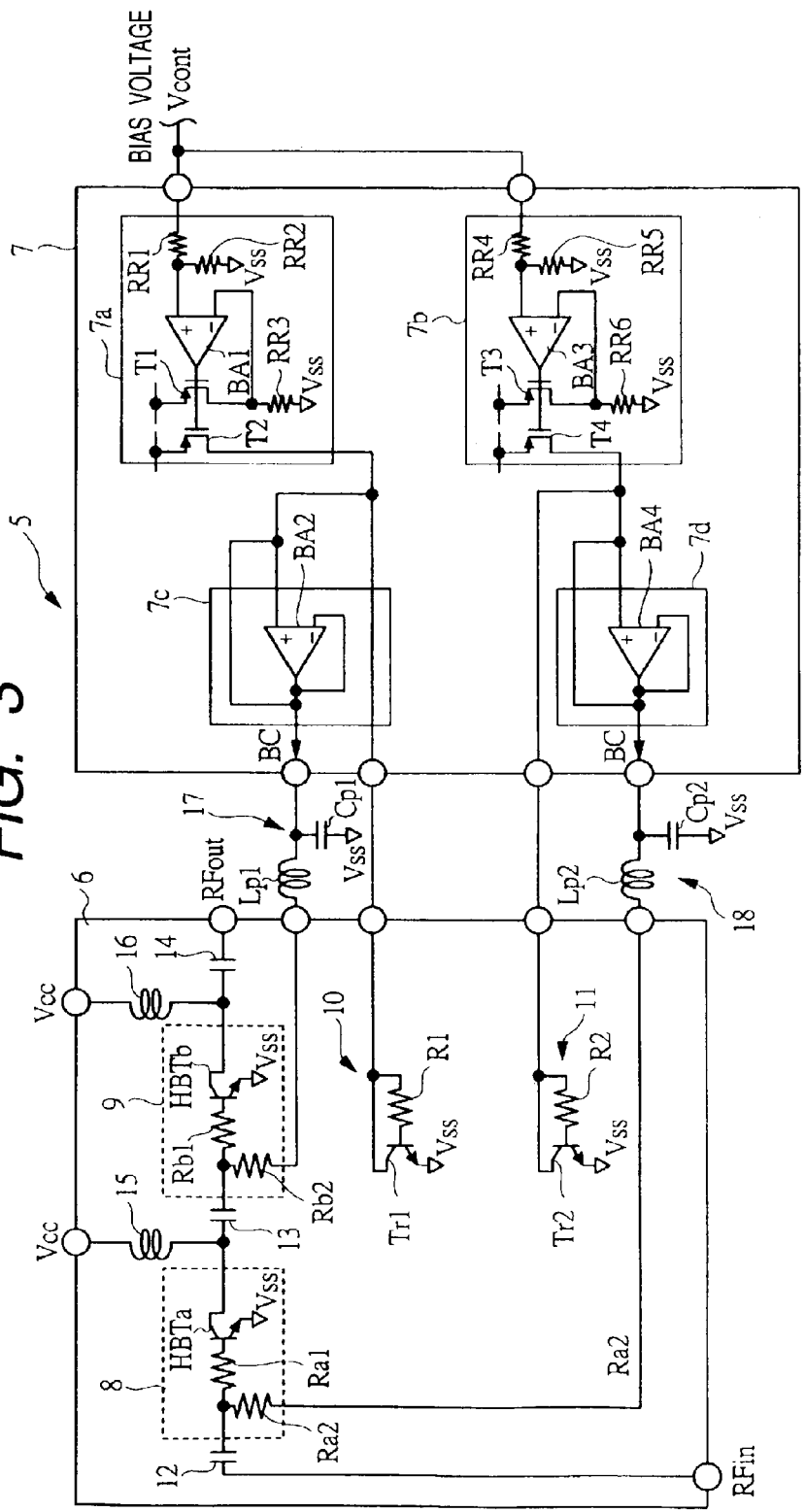
FIG. 3 is a circuit diagram of the power amplifier module shown in FIG. 2.
Figure 4:
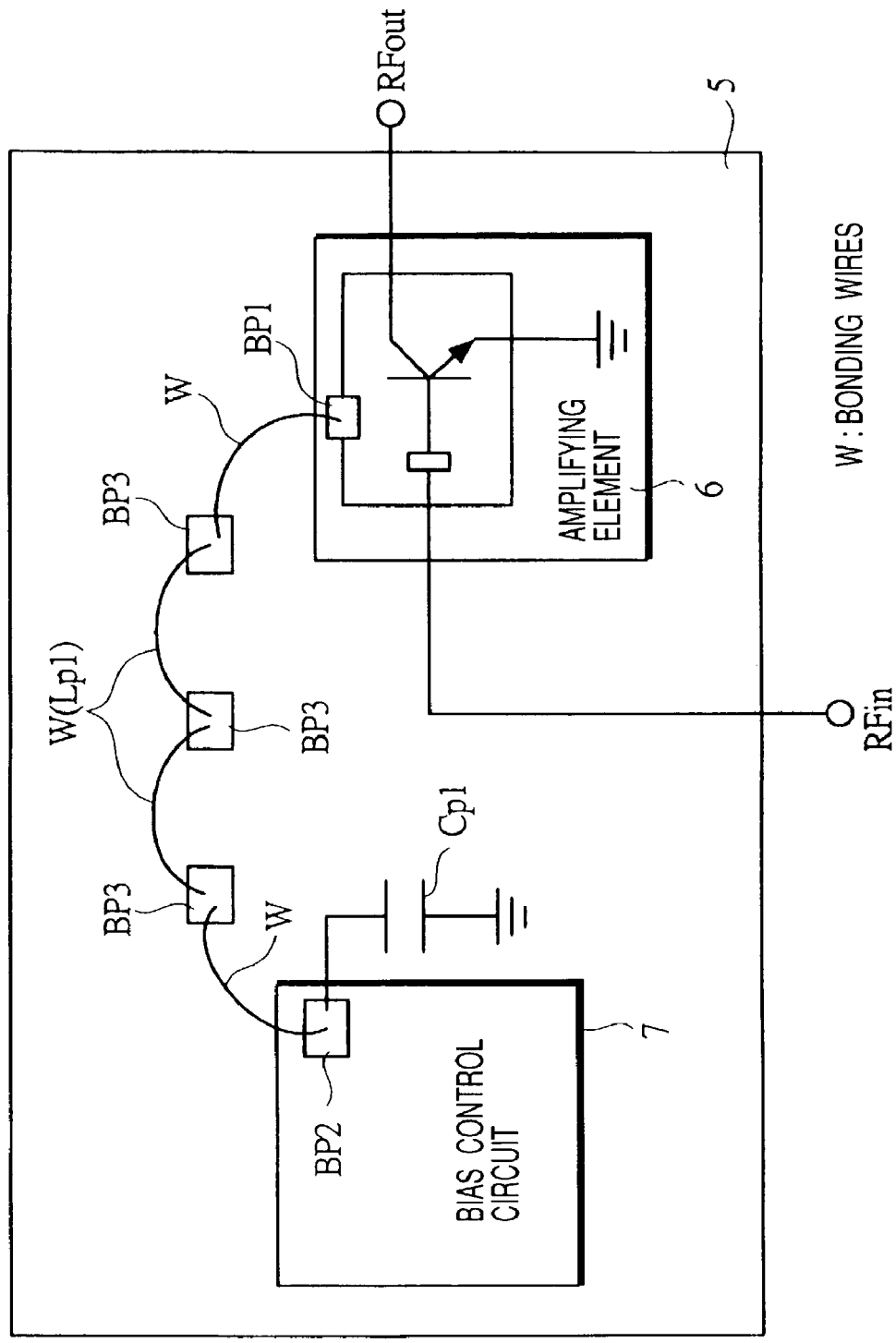
FIG. 4 is a diagram for describing inductances constituting low pass filters provided in the power amplifier module shown in FIG. 3.

FIG. 1 is a block diagram schematically showing a mobile communication apparatus according to one embodiment of the present invention, FIG. 2 is a block diagram of a power amplifier module provided in the mobile communication apparatus shown in FIG. 1, FIG. 3 is a circuit diagram of the power amplifier module shown in FIG. 2, and FIG. 4 is a diagram for describing inductances which constitute low pass filters provided in the power amplifier module shown in FIG. 3, respectively.

In the present embodiment, a mobile communication apparatus 1 such as a cellular phone or the like comprises an antenna 2, a duplexer 3, a low noise amplifier 4, and a power amplifying or amplifier module (high frequency power amplifier module) 5, and the like as shown in FIG. 1.

The antenna 2 performs the transfer of a communication radio wave. The duplexer 3 is connected to the antenna 2, and the low noise amplifier 4 and the power amplifier module 5 are respectively connected to the duplexer 3.

The duplexer 3 is a filter which performs demultiplexing of a transmitting-side signal and a receiving-side signal transmitted and received from the antenna 2. The low noise amplifier 4 amplifies the receive signal, and the power amplifier module 5 amplifies the transmit signal.

The receive signal received by the antenna 2 is amplified by the low noise amplifier 4 through the duplexer 3, followed by output to a post-stage frequency converter or the like. The modulated transmit signal is amplified up to power achievable to a base station by the power amplifier module 5, after which the signal is transmitted from the antenna 2 through the duplexer 3.

A configuration of the power amplifier module 5 will further be described.

As shown in FIG. 2, the power amplifier module 5 comprises a high-frequency amplifying unit 6, and a bias control circuit 7. The high-frequency amplifying unit 6 has a configuration wherein a first-stage amplifier 8 and a post-stage amplifier 9 are connected in series.

An input unit or portion of the first-stage amplifier 8 serves as a signal input unit or portion of the high-frequency amplifying unit 6, and an output unit or portion of the post-stage amplifier 9 serves as a signal output unit or portion of the high-frequency amplifying unit 6. The first-stage amplifier 8 amplifies a signal inputted through the duplexer 3, and the post-stage amplifier 9 amplifies a signal outputted from the first-stage amplifier 8.

The bias control circuit 7 performs bias compensation or correction control when the high-frequency amplifying unit 6 is changed in power amplification factor, output power and the like due to the temperature or the like.

A circuit configuration of the power amplifier module 5 will further be described using FIG. 3.

The high-frequency amplifying unit 6 comprises a first-stage amplifier 8, a post-stage amplifier 9, reference voltage generating circuits (reference voltage generation parts) 10 and 11, condensers 12 through 14, choke coils 15 and 16, and low-pass filters 17 and 18.

The first-stage amplifier 8 is made up of a transistor (second transistor) HBTa, and resistors Ra1 and Ra2. The post-stage amplifier 9 comprises a transistor HBTb and resistors Rb1 and Rb2. The transistors HBTa and HBTb are respectively made up of heterojunction bipolar transistors.

While the first-stage amplifier 8 is made up of one transistor HBTa in FIG. 3, it may comprise so-called multifinger transistors wherein a plurality of the transistors HBTa are connected in parallel.

While the post-stage amplifier 9 is also made up of one transistor HBTb in FIG. 3 in a manner similar to the above, it may be made up of a multifinger transistor configuration wherein a plurality of the transistors HBTb are connected in parallel.

The resistors Ra1 and Rb1 are ballast resistors, whereas the resistors Ra2 and Rb2 are voltage drop producing resistors, respectively. These resistors Ra2 and Rb2 produce voltage drops when currents flowing through the transistors HBTa and HBTb increase due to a rise in temperature, thereby suppressing thermal runaway of the transistors HBTa and HBTb. Each of the choke coils 15 and 16 suppresses the leakage of a high frequency signal.

One connecting portion of the resistor Ra1 is connected to the base of the transistor HBTa. One connecting portion of the resistor Ra2 and one connecting portion of the condenser 12 are respectively connected to the other connecting portion of the resistor Ra1.

An input signal RFin is connected to the other connecting portion of the condenser 12 so that it is inputted thereto. The other connecting portion of the choke coil 15 and one connecting portion of the condenser 13 are respectively connected to the collector of the transistor HBTa. A power supply voltage Vcc is connected to one connecting portion of the choke coil 15.

One connecting portions of the resistors Rb1 and Rb2 are respectively connected to the other connecting portion of the condenser 13, and the base of the transistor HBTb is connected to the other connecting portion of the resistor Rb1.

One connecting portion of the condenser 14 and the other connecting portion of the choke coil 16 are respectively connected to the collector of the transistor HBTb. The power supply voltage Vcc is connected to one connecting portion of the choke coil 16 so that an output signal Rfout is outputted via the condenser 14.

A reference potential Vss (ground potential) is connected to the emitters of the transistors HBTa and HBTb respectively.

The reference voltage generating circuits 10 and 11 comprise transistors Tr1 and Tr2 and resistors R1 and R2 respectively. The transistors Tr1 and Tr2 are also made up of heterojunction bipolar transistors in the same manner as described above and diode-connected.

One connecting portions of the resistors R1 and R2 are connected to the bases of the transistors Tr1 and Tr2. The reference potential Vss is connected to the emitters of the transistors Tr1 and Tr2. The other connecting portions of the resistors R1 and R2 are connected to the collectors of the transistors Tr1 and Tr2.

The bias control circuit 7 comprises current converting units 7a and 7b, and amplifying units 7c and 7d. The current converting unit (first bias control circuit) 7a comprises a buffer amplifier (op amplifier) BA1, resistors RR1 through RR3, and transistors T1 and T2.

The current converting unit (second bias control circuit) 7b comprises a buffer amplifier (op amplifier) BA3, resistors RR4 through RR6, and transistors T3 and T4. The transistors T1 through T4 are made up of MOS transistors.

The amplifying unit (first bias control circuit) 7c comprises a buffer amplifier (op amplifier) BA2, and the amplifying unit 7d (second bias control circuit) comprises a buffer amplifier (op amplifier) BA4.

A bias voltage Vcont outputted from a control circuit or the like is connected to one connecting portions of the resistors RR1 and RR4 so that it is inputted thereto. One connecting portion of the resistor RR2 and a positive (+) side input terminal of the buffer amplifier BA1 are respectively connected to the other connecting portion of the resistor RR1.

The gates of the transistors T1 and T2 are respectively connected to an output terminal of the buffer amplifier BA1. The power supply voltage Vcc is connected to one connecting portions of the transistors T1 and T2.

One connecting portion of the resistor RR3 and a negative (−) side terminal of the buffer amplifier BA1 are respectively connected to the other connecting portion of the transistor T1. The reference potential Vss is connected to the other connecting portions of the resistors RR2 and RR3 respectively.

A positive-side input terminal and an output terminal of the buffer amplifier BA2 are respectively connected to the other connecting portion of the transistor T2. The collector of the transistor Tr1 in the reference voltage generating circuit 10 is connected to the other connecting portion of the transistor T2.

A negative-side input terminal of the buffer amplifier BA2 is connected to the output terminal of the buffer amplifier BA2, and a bias control signal BC is outputted from the output terminal of the buffer amplifier BA2.

Since the buffer amplifiers BA3 and BA4, the resistors RR4 through RR6 and the transistors T3 and T4 are also similar in connection configuration to the buffer amplifiers BA1 and BA2, the resistors RR1 through RR3 and the transistors T1 and T2, their description will be omitted.

The low-pass filters 17 and 18 comprise an inductance Lp1 and a condenser (electrostatic capacitive element) Cp1, and an inductance Lp2 and a condenser (electrostatic capacitive element) Cp2 respectively.

The condensers Cp1 and Cp2 cause the impedance to approach 0 Ω at an envelope frequency of a modulated high frequency signal, thereby attenuating the envelope frequency. Each of the inductances Lp1 and Lp2 suppresses a change in impedance at a carrier frequency of a modulated signal.

One connecting portion of the condenser Cp1 and the output terminal of the buffer amplifier BA2 are respectively connected to one connecting portion of the inductance Lp1, and the other connecting portion of the resistor Rb2 in the post-stage amplifier 9 is connected to the other connecting portion of the inductance Lp1.

One connecting portion of the condenser Cp2 and the output terminal of the buffer amplifier BA4 are respectively connected to one connecting portion of the inductance Lp2. The other connecting portion of the resistor Ra2 in the first-stage amplifier 8 is connected to the other connecting portion of the inductance Lp2.

Thus, bias control signals BC outputted from the output terminals of the buffer amplifiers BA2 and BA4 are respectively outputted to the post-stage amplifier 9 and the first-stage amplifier 8 through the low-pass filters 17 and 18.

The operation of the bias control circuit 7 employed in the present embodiment will next be described.

Incidentally, while a description will be made here of operations of the buffer amplifiers BA1 and BA2, the resistors RR1 through RR3 and the transistors T1 and T2, the buffer amplifiers BA3 and BA4, the resistors RR4 through RR6 and the transistors T3 and T4 are also operated in the same manner as described above.

When the bias voltage Vcont is first inputted to the bias control circuit 7, a voltage divided by the resistors RR1 and RR2 is inputted to the positive-side input terminal of the buffer amplifier BA1.

Since the buffer amplifier BA1 takes a voltage follower configuration, the voltage inputted to the positive-side input terminal of the buffer amplifier BA1 is amplified and thereafter outputted from the output terminal of the buffer amplifier BA1.

The voltage outputted from the buffer amplifier BA1 is current-converted by the transistor T1. The transistor T2 sets the current flowing into the transistor T1 as a reference current and causes the same current value as that of the reference current to flow therein.

Since the transistor T2 is of the MOS transistor here, a voltage drop is little developed between one and other connecting portions of the transistor T2 (between drain/source thereof), so that the value of the bias voltage Vcont can be reduced. Thus, the bias voltage Vcont can be lowered.

The current supplied from the transistor T2 is used to produce a given reference voltage by the reference voltage generating circuit 10. The buffer amplifier BA2 amplifies the reference voltage and outputs it as a bias control signal BC.

The bias control signal BC is outputted to the high-frequency amplifying unit 6 through the low-pass filter 17. The low-pass filter 17 causes a bias DC component to pass therethrough and brings an envelope frequency and a carrier frequency into low impedance and high impedance respectively. Consequently, an adjacent channel leakage power ratio can be improved.

The technology of forming the inductance Lp1 of the low-pass filter 17 will be explained using FIG. 4. While a description will be made of the inductance Lp1 herein, the inductance Lp2 is also formed in the same manner.

The inductance Lp1 is formed by providing bonding electrodes BP1 and BP2 in the high-frequency amplifying unit 6 and the bias control circuit 7, respectively, in the power amplifying module 5, providing a plurality of bonding electrodes BP3 even between the bonding electrodes BP1 and BP2 at arbitrary positions, and connecting the bonding electrodes BP1 through BP3 by bonding wires W. Consequently, inductance components can be flexibly configured.

Thus, according to the embodiment, the bias voltage Vcont of the bias control circuit 7 can be reduced. It is therefore possible to realize reductions in size, cost and power consumption of the power amplifier module 5.

The low-pass filters 17 and 18 enable a reduction in the degradation of an adjacent channel leakage power ratio.

Figure 5:
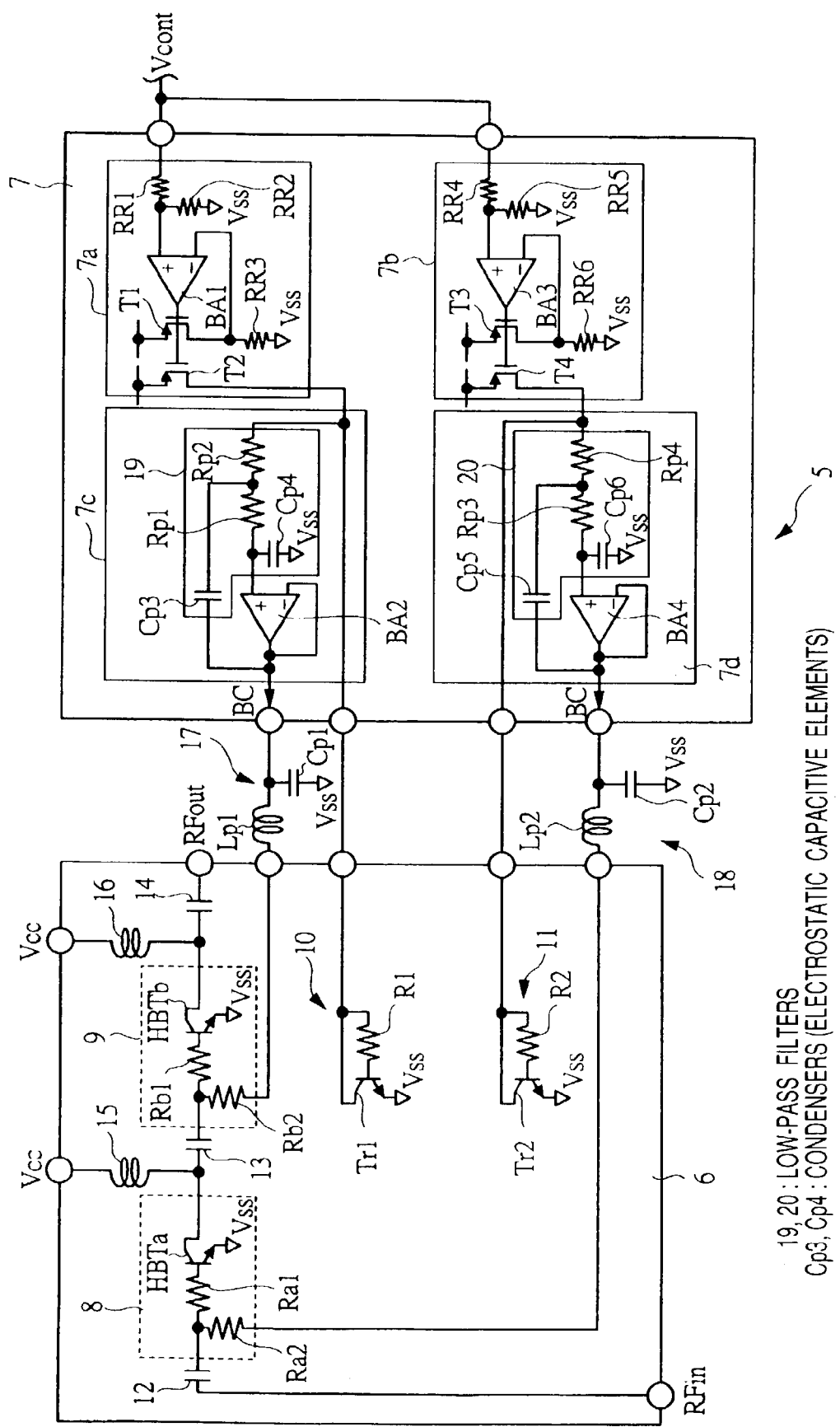
FIG. 5 is a circuit diagram of a power amplifier module provided in a mobile communication apparatus according to another embodiment of the present invention.

Further, while the low-pass filters 17 and 18 are provided between the high-frequency amplifying unit 6 and the bias control circuit 7 in the present embodiment, buffer amplifiers BA2 and BA4 in a bias control circuit 7 may be provided with low-pass filters 19 and 20 as shown in FIG. 5, for example.

In this case, the low-pass filter 19 is made up of resistors Rp1 and Rp2, and condensers (electrostatic capacitive elements) Cp3 and Cp4. The low-pass filter 20 also comprises resistors Rp3 and Rp4 and condensers Cp5 and Cp6 in the same manner as described above.

The other connecting portion of a transistor T2 is connected to one connecting portion of the resistor Rp2 in the low-pass filter 19. One connecting portion of the resistor Rp1 and one connecting portion of the condenser Cp3 are respectively connected to the other connecting portion of the resistor Rp2.

An output terminal of the buffer amplifier BA2 is connected to the other connecting portion of the condenser Cp3. One connecting portion of the condenser Cp4 and a positive-side input terminal of the buffer amplifier BA2 are connected to the other connecting portion of the resistor Rp1. A reference potential Vss is connected to the other connecting portion of the condenser Cp4.

Since the low-pass filter 20 is identical in connection configuration to the low-pass filter 19, its description will be omitted. Further, since other circuit connection configurations of a high-frequency amplifying unit 6 and the bias control circuit 7 are identical to those shown in FIG. 3, their description will be omitted.

Allowing the buffer amplifiers BA2 and BA4 provided with the low-pass filters 19 and 20 to have such a configuration as to attenuate a band of an envelope frequency (about 5 MHz or less) makes it possible to reduce a noise signal which leaks through the bias control circuit 7 and reduce receiving-band noise. This has an effect even on a reduction in adjacent channel leakage power ratio.

While the invention developed above by the present inventors has been described specifically based on the illustrated embodiments, the present invention is not limited to the embodiments. It is needless to say that various changes can be made thereto within the scope not departing from the substance thereof.

While, for example, the first-stage amplifier and post-stage amplifier of the high-frequency amplifying unit have adopted such configurations as to input the bias control signals through the low-pass filters in the illustrated embodiments, the low-pass filters are capable of reducing degradation of an adjacent channel leakage power ratio satisfactorily even if such a configuration as to input the bias control signal to the post-stage amplifier alone through the low-pass filter is taken.

Advantageous effects obtained by a representative one of the inventions disclosed in the present application will be described in brief as follows:

(1) Since a bias voltage for a bias control circuit can be lowered, reductions in size, cost and power consumption of a high frequency power amplifier module can be realized.

(2) Owing to low-pass filters, degradation of an adjacent channel leakage power ratio can be reduced.

What is claimed is:

1. A high frequency power amplifier module, comprising:
a first transistor which performs current amplification in response to an input signal received at a base terminal thereof, the base terminal being biased based on a first bias control signal;
a first bias control circuit having an input which receives a bias voltage and an output which generates the first bias control signal, wherein the first bias control circuit includes:
a first current conversion unit which converts the bias voltage into a first converted current; and
a first buffer amplifier having an input coupled to an output of the current conversion unit and an output coupled to the output of the first bias control circuit;
a first low-pass filter coupled between the output of the first bias control circuit and the base terminal of the first transistor; and
a first reference voltage generating unit which receives the first converted current from the first current conversion unit and which generates a first reference voltage based on the first converted current, wherein the first reference voltage is amplified by the first buffer amplifier and is provided to the first low-pass filter,
wherein the first current conversion unit comprises:
an op amplifier having a voltage follower configuration;
a first MOS transistor which has a gate connected to an output portion of the op amplifier and which is coupled in series between a power supply voltage and a reference potential to generate a first current; and
a second MOS transistor whose gate is coupled to the output portion of the op amplifier and which is coupled in series between the power supply voltage and the first reference voltage generating unit to generate a second current of the same level as the first current, and
wherein the first buffer amplifier includes a voltage follower-coupled op amplifier.

2. The high frequency power amplifier module according to claim 1, further comprises:
a second transistor which is coupled to the base terminal of the first transistor and performs current amplification in response to an input signal received at a base terminal thereof, the base terminal thereof being biased based on a second bias control signal;
a second bias control circuit which generates the second bias control signal supplied to the base terminal of the second transistor;
a second low-pass filter coupled between an output of the second bias control circuit and the base terminal of the second transistor; and
a second reference voltage generating unit which generates a second reference voltage from a second converted current,
wherein the second bias control circuit includes:
a second current conversion unit which converts the bias voltage into the second converted current; and
a second buffer amplifier which amplifies the second reference voltage generated by the second reference voltage generating unit and provides the amplified voltage second reference voltage to the second low-pass filter.

3. The high frequency power amplifier module comprising:
a first transistor which performs current amplification in response to an input signal received at a base terminal thereof, the base terminal being biased based on a first bias control signal;
a first bias control circuit having an input which receives a bias voltage and an output which generates the first bias control signal, wherein the first bias control circuit includes;
a first current conversion unit which converts the bias voltage into a first converted current; and
a first buffer amplifier having an input coupled to an output of the current conversion unit and an output coupled to the output of the first bias control circuit;
a first low-pass filter coupled between the output of the first bias control circuit and the base terminal of the first transistor; and
a first reference voltage generating unit which receives the first converted current from the first current conversion unit and which generates a first reference voltage based on the first converted current, wherein the first reference voltage is amplified by the first buffer amplifier and is provided to the first low-pass filter,
wherein the first low-pass filter includes:
an inductance coupled in series between the output portion of the first bias control circuit and the base terminal of the transistor; and
an electrostatic capacitive element coupled between the inductance and the reference potential, and
wherein the inductance is formed of bonding wires.

4. The high frequency power amplifying module according to claim 2, wherein input portions of the first and second bias control circuits are commonly coupled and inputted with the bias voltage in common.

5. The high frequency power amplifier module according to claim 1, wherein the first low-pass filter is provided at an input-side terminal of an op amplifier in the first buffer amplifier.

6. The high frequency power amplifier module according to claim 1, wherein the first transistor includes a plurality of transistors parallel-connected to one another.

7. The high frequency power amplifier module according to claim 2, wherein the second transistor includes a plurality of second transistors parallel-connected to one another.

8. The high frequency power amplifier module according to claim 1, wherein the first transistor is a GaAs HBT.

9. The high frequency power amplifier module according to claim 2, wherein the second transistor is a GaAs HBT.

10. The high frequency power amplifier module according to claim 3, further comprising:
a second transistor which is coupled to the base terminal of the first transistor and performs current amplification in response to an input signal received at a base terminal thereof, the base terminal thereof being biased based on a second bias control signal;
a second bias control circuit which generates the second bias control signal supplied to the base terminal of the second transistor;
a second low-pass filter coupled between an output of the second bias control circuit and the base terminal of the second transistor; and
a second reference voltage generating unit which generates a second reference voltage from a second converted current,
wherein the second bias control circuit includes:
a second current conversion unit which converts the bias voltage into the second converted current; and
a second buffer amplifier which amplifies the second reference voltage generated by the second reference voltage generating unit and provides the amplified voltage second reference voltage to the second low-pass filter.

11. The high frequency power amplifier module according to claim 3,
wherein the first current conversion unit includes:
an op amplifier having a voltage follower configuration;
a first MOS transistor which has a gate connected to an output portion of the op amplifier and which is coupled in series between a power supply voltage and a reference potential to generate a first current; and
a second MOS transistor whose gate is coupled to the output portion of the op amplifier and which is coupled in series between the power supply voltage and the first reference voltage generating unit to generate a second current of the same level as the first current,
wherein the first buffer amplifier includes a voltage follower-coupled op amplifier.

12. The high frequency power amplifying module according to claim 3, wherein input portions of the first and second bias control circuits are commonly coupled and inputted with the bias voltage in common.

13. The high frequency power amplifier module according to claim 3, wherein the first low-pass filter is provided at an input-side terminal of an op amplifier in the first buffer amplifier.

14. The high frequency power amplifier module according to claim 3, wherein the first transistor includes a plurality of transistors parallel-connected to one another.

15. The high frequency power amplifier module according to claim 3, wherein the second transistor includes a plurality of second transistors parallel-connected to one another.

16. The high frequency power amplifier module according to claim 3, wherein the first transistor is a GaAs HBT.

17. The high frequency power amplifier module according to claim 3, wherein the second transistor is a GaAs HBT.

* * * * *